(12) United States Patent
Song et al.

(10) Patent No.: US 11,397,290 B2
(45) Date of Patent: Jul. 26, 2022

(54) FILTER STRUCTURE AND METHOD FOR MANUFACTURING SAME, AND DISPLAY DEVICE

(71) Applicant: BOE Technology Group Co., Ltd., Beijing (CN)

(72) Inventors: Xiaoxin Song, Beijing (CN); Feng Zhang, Beijing (CN); Wenqu Liu, Beijing (CN); Zhijun Lv, Beijing (CN); Liwen Dong, Beijing (CN); Zhao Cui, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 191 days.

(21) Appl. No.: 16/763,257

(22) PCT Filed: Dec. 13, 2019

(86) PCT No.: PCT/CN2019/125382
§ 371 (c)(1),
(2) Date: May 12, 2020

(87) PCT Pub. No.: WO2020/147473
PCT Pub. Date: Jul. 23, 2020

(65) Prior Publication Data
US 2021/0033761 A1 Feb. 4, 2021

(30) Foreign Application Priority Data

Jan. 16, 2019 (CN) .......................... 201910039622.8

(51) Int. Cl.
*G02B 5/20* (2006.01)
*G02B 5/26* (2006.01)
(Continued)

(52) U.S. Cl.
CPC .............. *G02B 5/206* (2013.01); *B82Y 20/00* (2013.01); *G02B 5/201* (2013.01); *G02B 5/26* (2013.01);
(Continued)

(58) Field of Classification Search
CPC ........... B82Y 20/00; G02F 2001/01791; G02F 1/133614; G02F 1/133514; H01L 27/322; G02B 5/201
See application file for complete search history.

(56) References Cited

U.S. PATENT DOCUMENTS

2007/0200492 A1* 8/2007 Cok ..................... H01L 51/5284
313/506
2011/0128476 A1* 6/2011 Park .................. G02F 1/133514
349/96
(Continued)

FOREIGN PATENT DOCUMENTS

CN 104752620 A 7/2015
CN 104808383 A 7/2015
(Continued)

OTHER PUBLICATIONS

Office Action for corresponding Chinese Application 2019100398622.8 dated May 11, 2020.
(Continued)

*Primary Examiner* — Michael H Caley
*Assistant Examiner* — Jonathan Y Jung
(74) *Attorney, Agent, or Firm* — ArentFox Schiff LLP; Michael Fainberg

(57) ABSTRACT

A filter structure and a method for manufacturing the same, and a display device. The filter structure includes a base substrate and a plurality of filter units positioned on the base substrate, at least part of the filter units including a quantum dot filter layer. The filter units further include a reflective
(Continued)

structure whose orthographic projection on the base substrate surrounds the orthographic projection of the quantum dot filter layer on the base substrate. A distance between a plane of the reflective structure away from the base substrate and the base substrate is greater than a distance between a plane of the quantum dot filter layer close to the base substrate and the base substrate.

19 Claims, 5 Drawing Sheets

(51) Int. Cl.
    *G02F 1/1335* (2006.01)
    *G02F 1/13357* (2006.01)
    *H01L 27/32* (2006.01)
    *B82Y 20/00* (2011.01)
    *G02F 1/017* (2006.01)

(52) U.S. Cl.
    CPC .... *G02F 1/01791* (2021.01); *G02F 1/133512* (2013.01); *G02F 1/133514* (2013.01); *G02F 1/133617* (2013.01); *G02F 1/133621* (2013.01); *H01L 27/322* (2013.01); *G02F 2202/36* (2013.01)

(56) References Cited

U.S. PATENT DOCUMENTS

| | | | |
|---|---|---|---|
| 2012/0019740 A1* | 1/2012 | Kadowaki | G02B 5/201 349/61 |
| 2017/0293182 A1* | 10/2017 | Hu | G02F 1/133621 |
| 2018/0045866 A1 | 2/2018 | Chae et al. | |
| 2018/0157083 A1* | 6/2018 | Yeo | G02F 1/133514 |
| 2019/0088834 A1* | 3/2019 | Jin | H01L 27/322 |
| 2019/0390076 A1* | 12/2019 | Isonaka | C09D 11/322 |
| 2020/0136074 A1* | 4/2020 | Lee | H01L 27/322 |

FOREIGN PATENT DOCUMENTS

| | | |
|---|---|---|
| CN | 105044974 A | 11/2015 |
| CN | 105353556 A | 2/2016 |
| CN | 105929590 A | 9/2016 |
| CN | 106681046 A | 5/2017 |
| CN | 106707607 A | 5/2017 |
| CN | 107728368 A | 2/2018 |
| CN | 108107627 A | 6/2018 |
| CN | 108761894 A | 11/2018 |
| CN | 109491136 A | 3/2019 |
| KR | 20180036180 A | 4/2018 |

OTHER PUBLICATIONS

Decision of Rejection for corresponding Chinese Application 2019100398622.8 dated Jul. 9, 2020.

* cited by examiner

FILTER STRUCTURE AND METHOD FOR MANUFACTURING SAME, AND DISPLAY DEVICE

The present disclosure is a National Stage of International Application No. PCT/CN2019/125382, filed on Dec. 13, 2019, which claims the priority of the Chinese patent disclosure entitled "Filter Structure and Method for Manufacturing Same, and Display Device" with the publication No. 201910039622.8, filed with the Chinese Patent Office on Jan. 16, 2019, both of which are herein incorporated by reference in their entireties.

FIELD

The present disclosure relates to the technical field of display, particularly to a filter structure and a method for manufacturing the same, and a display device.

BACKGROUND

Quantum dots have the advantages of a tunable light emission wavelength, a narrow wavelength range of light emission coverage, high light emission efficiency, and good light, heat and chemical stability, etc., and are a light emitting material of a new generation applied to solid-state lighting and panchromatic flat panel display.

SUMMARY

According to the first aspect of the present disclosure, a filter structure provided by an embodiment of the present disclosure includes:

a base substrate; and a plurality of filter units positioned on the base substrate, at least part of the filter units including a quantum dot filter layer, the filter units further including a reflective structure whose orthographic projection on the base substrate surrounds an orthographic projection of the quantum dot filter layer on the base substrate, wherein a distance between a plane of the reflective facing away from the base substrate and the base substrate is greater than a distance between a plane of the quantum dot filter layer close to the base substrate and the base substrate.

In a possible embodiment, in a filter structure provided by an embodiment of the present disclosure, the distance between a plane of the reflective structure away from the base substrate and the base substrate is greater than or equal to a distance between a plane of the quantum dot filter layer away from the base substrate and the base substrate.

In a possible embodiment, in a filter structure provided by an embodiment of the present disclosure, the plane of the reflective structure away from the base substrate and the plane of the quantum dot filter layer away from the base substrate are flush.

In a possible embodiment, in a filter structure provided by an embodiment of the present disclosure, the reflective structure includes a support structure and a reflective metal layer coating the support structure.

In a possible embodiment, in a filter structure provided by an embodiment of the present disclosure, the filter structure further includes color filters positioned between the quantum dot filter layer and the base substrate and arranged corresponding to quantum dot filter layers of various colors, wherein one side of the base substrate away from the color filters is a light exit side of the filter structure.

In a possible embodiment, in a filter structure provided by an embodiment of the present disclosure, the color filters include a red filter, a green filter and a blue filter, wherein an edge thickness of the red filter and an edge thickness of the green filter are greater than a middle thickness thereof, and a thickness of the blue filter is uniform and equal to the edge thickness of the green filter and the edge thickness of the red filter.

In a possible embodiment, in a filter structure provided by an embodiment of the present disclosure, a plane of the red quantum dot filter layer away from the base substrate and a plane of the green quantum dot filter layer away from the base substrate are flush with a plane of the blue-green quantum dot filter layer away from the base substrate.

In a possible embodiment, a filter structure provided by an embodiment of the present disclosure further includes a protective layer covering the quantum dot filter layer and the reflective structure.

According to the second aspect of the present disclosure, embodiments of the present disclosure further provide a method for manufacturing a filter structure, the method including:

providing a base substrate;

forming the reflective structure on the base substrate; and forming the quantum dot filter layer in a region surrounded by the reflective structure.

In a possible embodiment, in a method for manufacturing a filter structure provided by an embodiment of the present disclosure, the forming the reflective structure on the base substrate includes:

forming a support structure on the base substrate; and forming, on the base substrate, a reflective layer coating the support structure.

In a possible embodiment, in a method for manufacturing a filter structure provided by an embodiment of the present disclosure, when the filter units include a red filter unit, a green filter unit and a blue filter unit, the forming the quantum dot filter layer on the base substrate includes:

forming a red filter in the red filter unit by using a halftone mask process, forming a green filter in the green filter unit by using a halftone mask process, and forming a blue filter in the blue filter unit, wherein the edge thickness of the red filter and the edge thickness of the green filter are greater than the middle thickness thereof, and the thickness of the blue filter is uniform and equal to the edge thickness of the green filter and the edge thickness of the red filter; and forming a red quantum dot filter layer on the red filter, forming a green quantum dot filter layer on the green filter, and forming a blue-green quantum dot filter layer on the blue filter.

According to the third aspect of the present disclosure, a display device is further provided by embodiments of the present disclosure, the display device including the filter structure according to any one of the embodiments according to the first aspect of the present disclosure.

In a possible embodiment, in a display device provided by an embodiment of the present disclosure, the display device further includes a white light organic light emitting diode display panel, wherein the filter structure is positioned on one side of a light exit surface of the white light organic light emitting diode display panel, and the filter units are positioned between the base substrate and the white light organic light emitting diode display panel, the white light organic light emitting diode display panel has a plurality of sub-pixel units that are arranged in one-to-one correspondence with the filter units.

In a possible embodiment, in a display device provided by an embodiment of the present disclosure, the display device further includes a blue-light drive backplane arranged on one side of the quantum dot filter layer away from the base substrate, and a liquid crystal display panel with no color resistance arranged on one side of the base substrate away from the quantum dot filter layer.

DETAILED DESCRIPTION OF THE EMBODIMENTS

Figure 1:
FIG. 1 is a structural schematic diagram of a filter structure according to an embodiment of the present disclosure.

In order to better understand the objectives, technical solutions and advantages of the present disclosure, the present disclosure will be further described in detail with reference to the drawings. It is apparent that the described embodiments are merely part of the embodiments of the present disclosure rather than all of the embodiments, and are merely disclosed for the purpose of illustrating and interpreting the present disclosure rather than limiting it. Moreover, in the case of non-conflict, the embodiments and the features in the embodiments of the present disclosure can be combined with each other. Based on the described embodiments of the present disclosure, all other embodiments obtained by those skilled in the art without paying creative labor shall fall into the protection scope of the present disclosure.

For illustrative purposes, shapes and sizes of various parts in the drawings do not reflect actual proportions, and merely serve as schematic illustrations of the present disclosure. Moreover, the same or similar reference signs always indicate the same or similar elements or elements having the same or similar functions.

Figure 2:
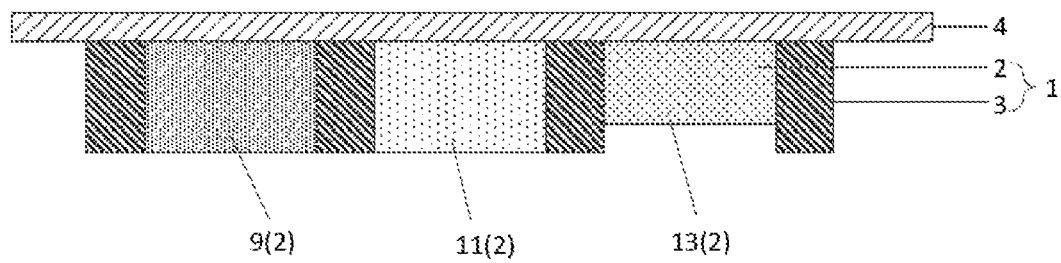
FIG. 2 is a structural schematic diagram of a further filter structure according to an embodiment of the present disclosure.
Figure 3:
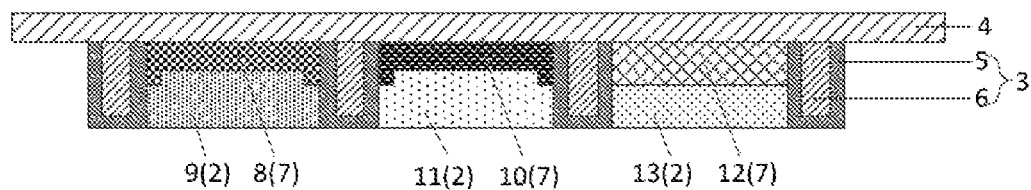
FIG. 3 is a structural schematic diagram of a further filter structure according to an embodiment of the present disclosure.

As shown in FIGS. 2 and 3, embodiments of the present disclosure provide a filter structure, the filter structure including:

a base substrate 4; and a plurality of filter units 1 positioned on the base substrate, at least part of the filter units 1 including a quantum dot filter layer 2, the filter units 1 further including a reflective structure 3 whose orthographic projection on the base substrate 4 surrounds the orthographic projection of the quantum dot filter layer 2 on the base substrate 4, wherein a distance between a plane of the reflective structure 3 away from the base substrate 4 and the base substrate 4 is greater than a distance between a plane of the quantum dot filter layers 2 close to the base substrate 4 and the base substrate 4.

It should be noted that in the filter structure provided by the embodiments of the present disclosure, there is not only a need for a region where the reflective structure is located to surround a region where the quantum dot filter layer is located but also a need to make the quantum dot filter layer have the orthographic projection on the reflective structure in order to make light emitted towards both sides from the quantum dot filter layers reflected to the region where the quantum dot filter layer is located, thereby improving light exit efficiency of the quantum dot filter layers while preventing light leakage.

In a filter structure provided by an embodiment of the present disclosure, a reflective structure enclosing quantum dot filter layer is arranged among filter units, and thus the reflective structure can prevent light leakage and reflect light scattered around by the quantum dot filter layer to a light exit region of the filter units, and the light reflected by the reflective structure can re-excite the quantum dot filter layer, thereby improving light emission efficiency of the quantum dot filter layer and light exit efficiency of the filter structure. Moreover, the light intensity under frontal view conditions can also be improved and the display effect can be enhanced.

Optionally, in the filter structure provided by an embodiment of the present disclosure, as shown in FIG. 2, a distance between a plane of the reflective structure 3 away from the base substrate 4 and the base substrate 4 is greater than or equal to a distance between a plane of the quantum dot filter layer 2 away from the base substrate 4 and the base substrate 4.

Specifically, a filter structure provided by an embodiment of the present disclosure includes a plurality of filter units, and quantum dot filter layers in the filter units of different colors may differ in light emitting intensity. In order to make the light emitting intensities of the quantum dot filter layers of different colors tend to be uniform, the thickness of the quantum dot filter layer having a strong light emitting intensity may be reduced and the thickness of the quantum dot filter layer having a weak light emitting intensity may be increased properly. Therefore, when configuring the reflective structure, it is required that the height of the reflective structure is at least equal to the thickness of the thickest quantum dot filter layer, and then the height of the reflective structure will be greater than the thickness of the thinnest quantum dot filter layer. Such a configuration can increase light emission efficiency of the quantum dot filter layers while reducing crosstalk between adjacent quantum dot filter layers.

Optionally, in the filter structure provided by an embodiment of the present disclosure, as shown in FIGS. 1 and 3, when planes of the quantum dot filter layers 2 away from the base substrate 4 remain flush, the plane of the reflective structure 3 away from the base substrate 4 can be made flush with the planes of the quantum dot filter layers 2 away from the base substrate 4.

Optionally, as shown in FIG. 3, the reflective structure 3 includes a support structure 6 and a reflective metal layer 5 coating the support structure 6.

In the filter structure provided by an embodiment of the present disclosure, the reflective metal layer can reflect light scattered around by the quantum dot filter layers to the light exit region of the filter units, and light reflected by the reflective structure can re-excite the quantum dot filter layers, which improves not only the light emission efficiency of the quantum dot filter layers and the light exit efficiency of the filter structure but also the light intensity under frontal view conditions and the display effect. Moreover, the process is simple and easy to achieve by providing the support structure and the reflective metal layer coating the support structure.

Optionally, in a filter structure according to an embodiment of the present disclosure, as shown in FIG. 2, the filter units 1 include a red quantum dot filter layer 9, a green quantum dot filter layer 11, and a blue quantum dot filter layer 13, wherein the thickness of the red quantum dot filter layer 9 and the thickness of the green quantum dot filter layer 11 are both greater than the thickness of the blue quantum dot filter layer 13.

Specifically, in the filter structure provided by an embodiment of the present disclosure, the light emitting intensity of the blue quantum dot filter layer is greater than the light emitting intensity of the red quantum dot filter layer and the light emitting intensity of the green quantum dot filter layer. Therefore, the thickness of the red quantum dot filter layer and the thickness of the green quantum dot filter layer may be set to be greater than the thickness of the blue quantum dot filter layer to ensure the uniform light emitting intensity of the quantum dot filter layers of various colors.

It should be noted that when a blue-light backlight is used for exciting the quantum dot filter layers of various colors, the blue quantum dot filter layer may be not arranged, and it is only required that blue light emitted from the backlight goes through a corresponding part in a region corresponding to the blue light. Thus the blue quantum dot filter layer may be selectively arranged.

Optionally, as shown in FIG. 3, the filter structure further includes color filters 7 positioned between the quantum dot filter layers 2 and the base substrate 4 and arranged corresponding to the quantum dot filter layers 2 of various colors, wherein one side of the base substrate 4 away from the color filters 7 is a light exit side of the filter structure.

A filter structure provided by an embodiment of the present disclosure is provided with color filters corresponding to the colors of the quantum dot filter layers so as to broaden the color gamut of the exit light colors of the filter units and improve the display effect and user experience.

Optionally, in the filter structure provided by an embodiment of the present disclosure, as shown in FIG. 3, the color filters 7 include a red filter 8, a green filter 10, and a blue filter 12.

Specifically, the edge thickness of the red filter 8 and the edge thickness of the green filter 10 are greater than the middle thickness thereof, the edge thicknesses and the middle thickness differ by about 0.5 um, and the width of the region where the edge is located is 1 um-5 um. The thickness of the blue filter 12 is uniform, and may be equal to the edge thickness of the red filter 8 and the edge thickness of the green filter 10. Certainly, the thickness of the blue filter 12 may also be greater than the edge thickness of the red filter 8 and the edge thickness of the green filter 10, so as to effectively ensure that the thickness of the red quantum dot filter layer 9 and the thickness of the green quantum dot filter layer 11 are both greater than the thickness of the blue quantum dot filter layer 13 to ensure exit light uniformity of red light, green light and blue light.

For example, the middle thickness of the red quantum dot filter layer and the middle thickness of the green quantum dot filter layer are greater than the edge thickness thereof, and the thickness of the blue-green quantum dot filter layer is uniform and smaller than the middle thickness of the red quantum dot filter layer and the middle thickness of the green quantum dot filter layer. In other words, the maximum thickness of the red quantum dot filter layer and the maximum thickness of the green quantum dot filter layer are greater than the thickness of the blue-green quantum dot filter layer, so that the light emitting intensities of the red filter unit and the green filter unit can be improved.

During the process of applying a filter structure to display, generally a blue backlight (a blue drive backplane) is used to excite quantum dot filter layers of various colors, and the selection of the blue backlight determines that the exit light intensity of the blue quantum dot filter layer will be greater than the exit light intensities of other colors, causing a display screen of a display panel to be bluish. In order to improve light exit uniformity of sub-pixels of the display panel, the thickness of the red quantum dot filter layer and the thickness of the green quantum dot filter layer may be increased to enhance the light emitting intensities of red light and green light.

Optionally, in a filter structure provided by an embodiment of the present disclosure, as shown in FIG. 3, after the red filter 8 and the green filter 10 are configured as grooves, the thickness of the red quantum dot filter layer 9 and the thickness of the green quantum dot filter layer 11 can be increased by arrangement of the grooves, and then the plane of the red quantum dot filter layer 9 away from the base substrate 4 and the plane of the green quantum dot filter layer 11 away from the base substrate 4 can be made flush with the plane of the blue-green quantum dot filter layer 13 away from the base substrate 4, thereby facilitating production of an encapsulation film layer.

The red filter and the green filter are configured as grooves, which can also gather light to some extent and further enhance the light intensity for exciting quantum dots, thereby achieving the purpose of increasing the light emitting intensities of red light and green light.

In a filter structure provided by an embodiment of the present disclosure, as shown in FIG. 3, the reflective structure 3 can also prevent the red filter 8 and the green filter 10 from collapsing during the process of forming the red filter 8 and the green filter 10 whose middle thickness is greater than the edge thickness thereof.

Figure 4:
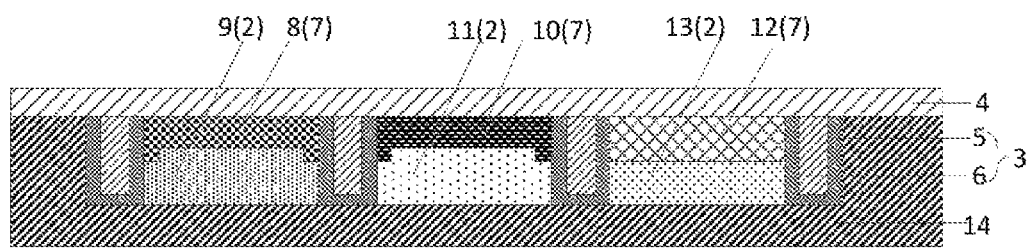
FIG. 4 is a structural schematic diagram of a further filter structure according to an embodiment of the present disclosure.

Optionally, as shown in FIG. 4, the filter structure further includes a protective layer 14 covering the quantum dot filter layers 2 and the reflective structure 3 to encapsulate the quantum dot filter layers 2 and the reflective structure 3 to prevent the quantum dot filter layers 2 and the reflective structure 3 from being corroded.

Figure 5:
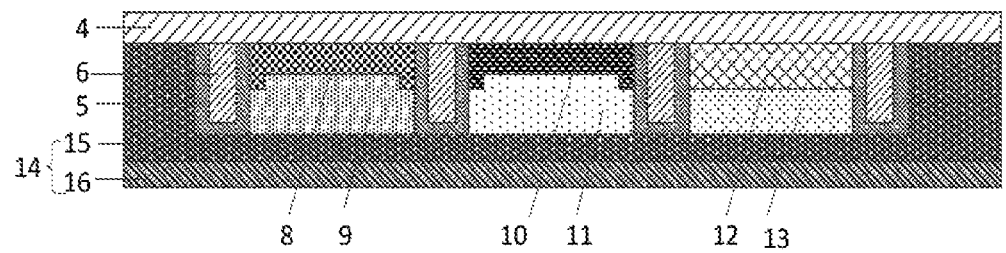
FIG. 5 is a structural schematic diagram of a further filter structure according to an embodiment of the present disclosure.

Specifically, as shown in FIG. 5, the protective layer 14 may include a first protective layer 15 and a second protective layer 16 positioned on one side of the first protective layer 15 away from the base substrate 4.

The first protective layer and the second protective layer can both use materials of the acrylic acid system. Materials of the acrylic acid system of the first protective layer account for about 15%, and materials of the acrylic acid system of the second protective layer account for 8%-12%. Besides, the viscosity of the first protective layer needs to be greater than the viscosity of the second protective layer, so that the first protective layer can coat other film layers in the filter structure and flatten a gap difference between layers. The second protective layer has the relatively small viscosity, and can be flattened on the surface of the first protective layer to further flatten the first protective layer.

A method for manufacturing a filter structure provided by an embodiment of the present disclosure includes:

providing a base substrate;

forming a reflective structure on the base substrate; and forming quantum dot filter layers in a region surrounded by the reflective structure.

Optionally, the forming a reflective structure on the base substrate specifically includes:

forming a support structure on the base substrate; and forming a reflective layer coating the support structure on the base substrate.

Optionally, the forming a support structure in the filter units on the base structure specifically includes: coating a photoresist on the base substrate and performing a patterning process on the photoresist form a support structure.

Optionally, the forming a reflective layer coating the support structure on the base substrate specifically includes: depositing a metal material on the base substrate and performing a patterning process on the metal material to form a reflective layer coating the support structure.

The metal material may be, e.g., a multi-layer metal stack, e.g., a stack of Ti/Al/Ti.

Optionally, the filter units include a red filter unit, a green filter unit and a blue filter unit, and the forming quantum dot filter layers in a plurality of filter units on the base substrate specifically includes:

forming a red filter in the red filter unit by using a halftone mask process, forming a green filter in the green filter unit by using a halftone mask process, and forming a blue filter in the blue filter unit, wherein the edge thickness of the red filter and the edge thickness of the green filter are greater than the middle thickness thereof, and the thickness of the blue filter is uniform and equal to the edge thickness of the green filter and the edge thickness of the red filter; and forming a red quantum dot filter layer on the red filter, forming a green quantum dot filter layer on the green filter and forming a blue-green quantum dot filter layer on the blue filter.

In this way, the middle thickness of the formed red quantum dot filter layer and the middle thickness of the formed green quantum dot filter layer are greater than the edge thickness thereof, and the thickness of the blue-green quantum dot filter layer is uniform and smaller than the middle thickness of the red quantum dot filter layer and the middle thickness of the green quantum dot filter layer.

Setting the thickness of the blue filter to be equal to the edge thickness of the green filter and the edge thickness of the red filter can effectively ensure that the deposition amount of the blue quantum dot filter layer corresponding to the blue filter can be smaller than the deposition amount of the red quantum dot filter layer and the deposition amount of the green quantum dot filter layer. Since the light emitted from quantum dots have anisotropy, not only the deposition thickness of the quantum dots but also the area of a region occupied by the quantum dots of a corresponding color impose influences upon the light emitting intensity of the color.

Moreover, setting the thickness of the blue filter to be equal to the edge thickness of the green filter and the edge thickness of the red filter facilitates design of a mask. Specifically, when the thickness of the blue filter is equal to the edge thickness of the green filter and the edge thickness of the red filter, it is only required to design two different exposure amounts for corresponding masks, i.e., one exposure amount corresponding to an opening region of the grooves, and the other exposure amount corresponding to edge regions of the grooves and a region where the blue filter is located. If the thickness of the blue filter is set to be different from the edge thickness of the green filter and the edge thickness of the red filter, then it is required to separately design, on the mask, an exposure amount corresponding to the region where the blue filter is located.

Optionally, the method further includes forming a protective layer covering the quantum dot filter layers and the reflective structure.

Optionally, the forming a protective layer covering the quantum dot filter layers and the reflective structure specifically includes: forming a first protective layer having a flattening function and covering the quantum dot filter layers and the reflective structure, and forming a second protective layer on one side of the first protective layer away from the reflective structure.

The first protective layer and the second protective layer can both use materials of the acrylic acid system. However, materials of the acrylic acid system of the first protective layer account for about 15%, and materials of the acrylic acid system of the second protective layer account for 8%-12%. Besides, the viscosity of the first protective layer needs to be greater than the viscosity of the second protective layer, so that the first protective layer can coat other film layers in the filter structure and flatten a gap difference between layers. The second protective layer has the relatively small viscosity, and can be flattened on the surface of the first protective layer to further flatten the first protective layer.

Figure 6:
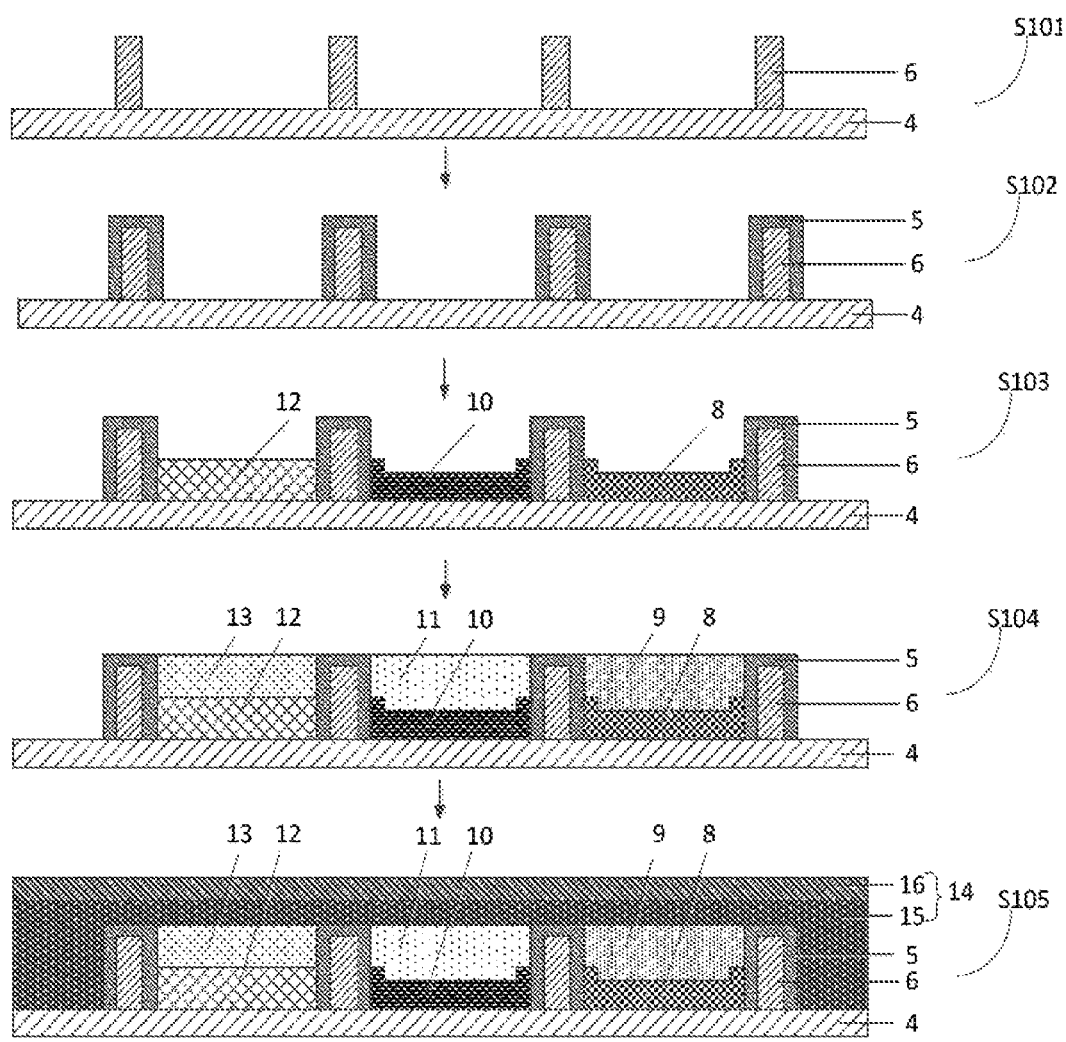
FIG. 6 is a schematic diagram of a method for manufacturing a filter structure according to an embodiment of the present disclosure.

In the following, the method for manufacturing a filter structure provided by an embodiment of the present disclosure will be illustrated. As shown in FIG. 6, the method for manufacturing a filter structure includes:

S101: coating a photoresist on the base substrate 4 and performing a patterning process on the photoresist to form the support structure 6, wherein, e.g., a photoresist layer with the thickness of 7 µm can be coated by using a photoresist application process at a rate of 450 µL/s, then exposed to 900 mJ for 140 seconds, developed by using a developer containing 2.38% of tetramethylammonium hydroxide (TMAH), and cured at 230° C. for 60 minutes;

S102: depositing a metal material on the base substrate 4 and performing a patterning process on the metal material to form the reflective layer 5 coating the support structure 6, wherein a stack of Ti/Al/Ti can be deposited by using a sputtering process, and the reflective layer can be formed by using a patterning process including exposing, developing and etching;

S103: forming the red filter 8 in the red filter unit by using a halftone mask process, forming the green filter 10 in the green filter unit by using a halftone mask process and forming the blue filter 12 in the blue filter unit, wherein, e.g., for the red filter unit and the green filter unit, a region adjacent to the reflective metal layer, i.e., the edge of the filter, can be 100% fully exposed and a middle region of the filter can be 50% exposed to form a filter whose edge thickness is greater than the middle thickness;

S104: forming the red quantum dot filter layer 9 on the red filter 8, forming the green quantum dot filter layer 11 on the green filter 10 and forming the blue quantum dot filter layer 13 on the blue filter 12; and S105: forming the protective layer 14, which specifically includes forming the first protective layer 15 having the flattening function and forming the second protective layer 16 on the first protective layer 15.

A display device provided by an embodiment of the present disclosure includes the above filter structure according to an embodiment of the present disclosure.

The display device provided by an embodiment of the present disclosure may be, e.g., a cell phone, a computer, a television and the like.

Figure 7:
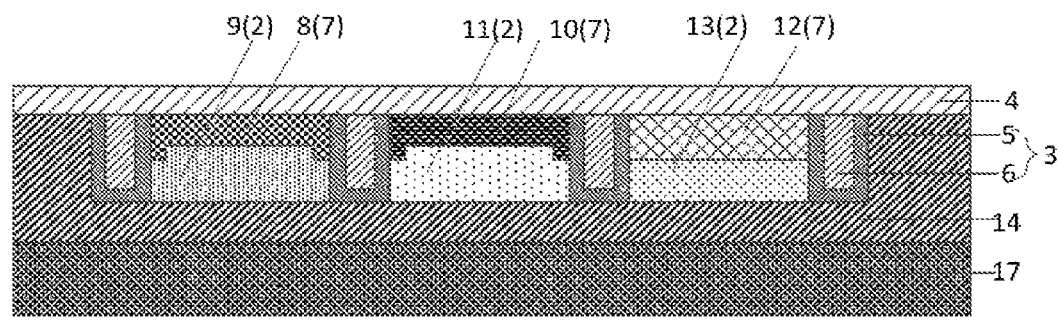
FIG. 7 is a schematic diagram of a display device according to an embodiment of the present disclosure.

Optionally, as shown in FIG. 7, the display device further includes a white light organic light-emitting diode (OLED) display panel 17, the filter structure being positioned on one side of a light exit surface of the white light organic light-emitting diode display panel 17, and the filter units being positioned between the base substrate 4 and the white light organic light-emitting diode display panel 17, wherein the white light organic light-emitting diode display panel 17 has a plurality of sub-pixel units that are in one-to-one correspondence with the filter units.

Figure 8:
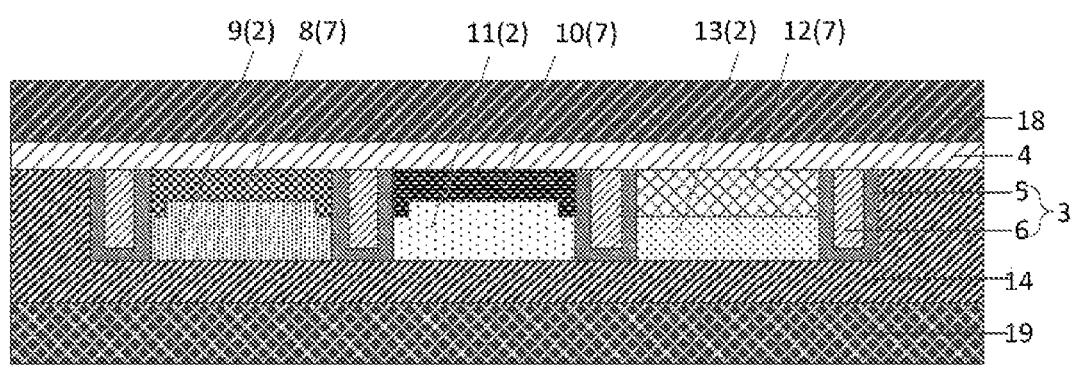
FIG. 8 is a schematic diagram of a further display device according to an embodiment of the present disclosure.

Optionally, as shown in FIG. 8, the display device further includes a blue-light drive backplane 19 arranged on one side of the quantum dot filter layer 2 away from the base substrate 4, and a liquid crystal display panel 18 with no color resistance arranged on one side of the base substrate 4 away from the quantum dot filter layers 2.

Since the filter structure is near the blue-light drive backplane, blue light emitted from the blue-light drive backplane directly irradiates the filter structure to excite quantum dot filter layers of various colors, and the excited light is then displayed via the liquid crystal display panel. The configuration of the filter structure can use all the light emitted from the blue-light drive backplane. If, as shown in FIG. 9, the liquid crystal display panel 18 is arranged between the blue-light drive backplane 19 and the filter structure, light emitted from the blue light drive backplane 19 will first go through the liquid crystal display panel 18 and part of the blue light will be blocked by the liquid crystal, and then the intensity of the blue light irradiated on the filter structure will be reduced.

Figure 9:
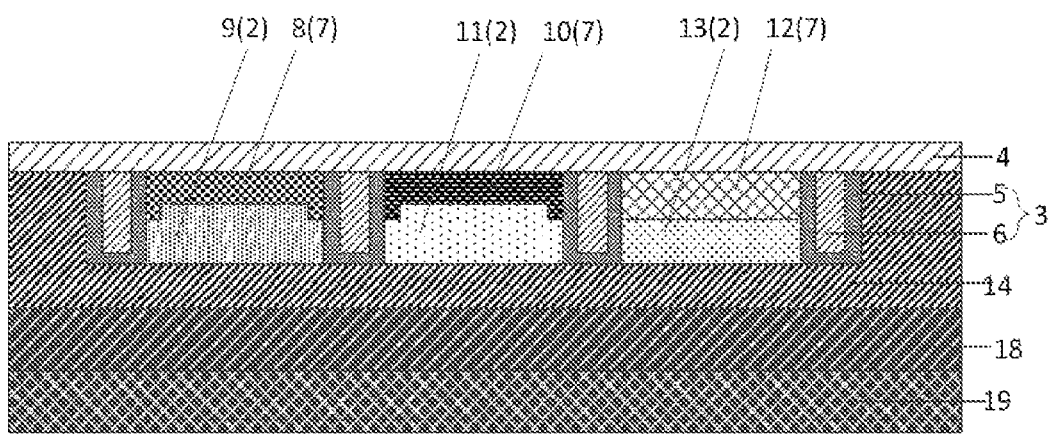
FIG. 9 is a schematic diagram of a further display panel according to an embodiment of the present disclosure.

Certainly, the structures of the display devices shown in FIGS. 8 and 9 can both realize display, and they both fall within the protection scope of the present disclosure. A selection may be specifically made according to the actual usage conditions, and is not specifically limited herein.

In other words, the filter structure and the drive backplane can be used as a backlight module. For example, a blue light emitting diode can be used as a backlight source, and blue light excites the red quantum dot filter layer to emit red light and the green quantum dot filter layer to emit green light. For illustrative purposes, when blue light is used to excite a quantum dot filter layer to emit light having a color of light emitted from sub-pixels, for a blue filter unit, even if a filter layer is not provided, emission of blue light can also be directly realized. However, since the red filter unit and the green filter unit are provided with quantum dot filter layers of corresponding colors, the blue filter unit directly realizing emission of blue light will cause the light intensity of blue sub-pixels to be greater than the light intensities of red sub-pixels and green sub-pixels, thereby producing a color difference. In the display device provided by an embodiment of the present disclosure, a quantum dot filter layer can be arranged in the blue filter unit so as to balance the light intensities of the blue sub-pixels, green sub-pixels and red sub-pixels and eliminate color differences of different filter units. Further, taking the filter structure shown in FIG. 2 as an example, since the maximum thickness of the red quantum dot filter layer and the maximum thickness of the green quantum dot filter layer are greater than the thickness of the blue-green quantum dot filter layer, the light emitting intensities of the red sub-pixels and the green sub-pixels can be improved to further eliminate color differences of different filter units.

Manufacturing a liquid crystal display device includes the steps of forming a thin-film transistor on a base substrate and subsequently arranging a quantum dot filter layer and a reflective structure on one side of the base substrate facing away from the thin-film transistor. In other words, the base substrate provided during the process of manufacturing a filter structure is a base substrate provided with a thin-film transistor. A process for manufacturing a thin-film transistor is further included prior to step S101, and the process may be, e.g., amorphous silicon (a-Si) process, oxide process or low temperature poly-silicon (LTPS) process. Besides, steps of forming a blue light drive backplane and attaching the blue light drive backplane and the filter structure are further included. For example, a nano-imprint process may be used to attach the blue light drive backplane and the second protective layer.

In summary, in a filter structure and a method for manufacturing the same, and a display device according to embodiments of the present disclosure, since a reflective structure enclosing quantum dot filter layers is arranged among filter units, the reflective structure can prevent light leakage and reflect light scattered around by the quantum dot filter layers onto a light exit region of the filter units, and the light reflected by the reflective structure can re-excite the quantum dot filter layers, which not only improves the light emission efficiency of the quantum dot filter layers and the light exit efficiency of the filter structure but also enhances the light intensity under frontal view conditions and the display effect.

It is apparent that various alternations and modifications may be made to the present disclosure by those skilled in the art, without departing from the spirit and scope of the present disclosure. Therefore, the alternations and modifications to the present disclosure within the scope of the claims of the present disclosure and their equivalents are to be construed as being included in the disclosure of the present disclosure.

The invention claimed is:

1. A filter structure, comprising:
   a base substrate; and
   a plurality of filter units positioned on the base substrate, at least part of the filter units comprising a quantum dot filter layer, and
   the filter units further comprising a reflective structure whose orthographic projection on the base substrate surrounds an orthographic projection of the quantum dot filter layer on the base substrate, wherein a distance between a plane of the reflective structure away from the base substrate and the base substrate is greater than a distance between a plane of the quantum dot filter layer close to the base substrate and the base substrate;
   wherein the filter structure further comprises color filters positioned between the quantum dot filter layer and the base substrate and arranged corresponding to quantum dot filter layers of various colors, wherein one side of the base substrate away from the color filters is a light exit side of the filter structure.

2. The filter structure according to claim 1, wherein the distance between the plane of the reflective structure away from the base substrate and the base substrate is greater than or equal to a distance between a plane of the quantum dot filter layer away from the base substrate and the base substrate.

3. The filter structure according to claim 2, wherein the plane of the reflective structure away from the base substrate and the plane of the quantum dot filter layer away from the base substrate are flush.

4. The filter structure according to claim 1, wherein the reflective structure comprises a support structure and a reflective metal layer coating the support structure.

5. The filter structure according to claim 1, wherein the filter units comprise a red quantum dot filter layer, a green quantum dot filter layer and a blue quantum dot filter layer, wherein a thickness of the red quantum dot filter layer and a thickness of the green quantum dot filter layer are both greater than a thickness of the blue quantum dot filter layer.

6. The filter structure according to claim 1, wherein the color filters comprise a red filter, a green filter and a blue filter, wherein an edge thickness of the red filter and an edge thickness of the green filter are greater than a middle thickness thereof, and a thickness of the blue filter is uniform and equal to the edge thickness of the green filter and the edge thickness of the red filter.

7. The filter structure according to claim 6, wherein a plane of the red quantum dot filter layer away from the base substrate and a plane of the green quantum dot filter layer away from the base substrate are flush with a plane of the blue-green quantum dot filter layer away from the base substrate.

8. The filter structure according to claim 1, further comprising a protective layer covering the quantum dot filter layer and the reflective structure.

9. A method for manufacturing the filter structure according to claim 1, comprising:
providing a base substrate;
forming the reflective structure on the base substrate;
forming the quantum dot filter layer in a region surrounded by the reflective structure; and
forming the color filters between the quantum dot filter layer and the base substrate.

10. The method according to claim 9, wherein the forming the reflective structure on the base substrate comprises:
forming a support structure on the base substrate; and
forming, on the base substrate, a reflective layer coating the support structure.

11. The method according to claim 9, wherein, when the filter units comprise a red filter unit, a green filter unit and a blue filter unit, the forming the quantum dot filter layer on the base substrate comprises:
forming a red filter in the red filter unit by using a halftone mask process, forming a green filter in the green filter unit by using a halftone mask process and forming a blue filter in the blue filter unit, wherein an edge thickness of the red filter and an edge thickness of the green filter are greater than a middle thickness thereof, and a thickness of the blue filter is uniform and equal to the edge thickness of the green filter and the edge thickness of the red filter; and
forming a red quantum dot filter layer on the red filter, forming a green quantum dot filter layer on the green filter and forming a blue-green quantum dot filter layer on the blue filter.

12. A display device, comprising the filter structure according to claim 1.

13. The display device according to claim 12, further comprising a white light organic light emitting diode display panel, wherein the filter structure is positioned on one side of a light exit surface of the white light organic light emitting diode display panel, and the filter units are positioned between the base substrate and the white light organic light emitting diode display panel, and
the white light organic light emitting diode display panel has a plurality of sub-pixel units that are arranged in one-to-one correspondence with the filter units.

14. The display device according to claim 12, further comprising:
a blue light drive backplane arranged on one side of the quantum dot filter layer away from the base substrate; and
a liquid crystal display panel with no color resistance arranged on one side of the base substrate away from the quantum dot filter layers.

15. A filter structure, comprising:
a base substrate; and
a plurality of filter units positioned on the base substrate, at least part of the filter units comprising a quantum dot filter layer, and
the filter units further comprising a reflective structure whose orthographic projection on the base substrate surrounds an orthographic projection of the quantum dot filter layer on the base substrate, wherein a distance between a plane of the reflective structure away from the base substrate and the base substrate is greater than a distance between a plane of the quantum dot filter layer close to the base substrate and the base substrate;
wherein the filter units comprise a red quantum dot filter layer, a green quantum dot filter layer and a blue quantum dot filter layer, wherein a thickness of the red quantum dot filter layer and a thickness of the green quantum dot filter layer are both greater than a thickness of the blue quantum dot filter layer.

16. The filter structure according to claim 15, wherein the distance between the plane of the reflective structure away from the base substrate and the base substrate is greater than or equal to a distance between a plane of the quantum dot filter layer away from the base substrate and the base substrate.

17. The filter structure according to claim 16, wherein the plane of the reflective structure away from the base substrate and the plane of the quantum dot filter layer away from the base substrate are flush.

18. The filter structure according to claim 15, wherein the reflective structure comprises a support structure and a reflective metal layer coating the support structure.

19. The filter structure according to claim 15, further comprising a protective layer covering the quantum dot filter layer and the reflective structure.

* * * * *